United States Patent
Tian

(10) Patent No.: US 9,698,385 B2
(45) Date of Patent: Jul. 4, 2017

(54) OLED DISPLAY PANEL AND DISPLAY DEVICE INCLUDING THE SAME

(71) Applicants: BOE TECHNOLOGY GROUP CO., LTD., Beijing (CN); BEIJING BOE CHATANI ELECTRONICS CO., LTD., Beijing (CN)

(72) Inventor: Qing Tian, Beijing (CN)

(73) Assignees: BOE TECHNOLOGY GROUP CO., LTD., Beijing (CN); BEIJING BOE CHATANI ELECTRONICS CO., LTD., Beijing (CN)

( * ) Notice: Subject to any disclaimer, the term of this patent is extended or adjusted under 35 U.S.C. 154(b) by 0 days.

(21) Appl. No.: 14/917,197

(22) PCT Filed: Sep. 21, 2015

(86) PCT No.: PCT/CN2015/090075
§ 371 (c)(1),
(2) Date: Mar. 7, 2016

(87) PCT Pub. No.: WO2016/173186
PCT Pub. Date: Nov. 3, 2016

(65) Prior Publication Data
US 2017/0069877 A1 Mar. 9, 2017

(30) Foreign Application Priority Data
Apr. 30, 2015 (CN) .................. 2015 2 0275554 U

(51) Int. Cl.
*H01L 51/52* (2006.01)
*H01L 27/32* (2006.01)

(52) U.S. Cl.
CPC .......... *H01L 51/5275* (2013.01); *H01L 27/32* (2013.01); *H01L 27/3211* (2013.01); *H01L 51/52* (2013.01); *H01L 51/5237* (2013.01); *H01L 51/5271* (2013.01)

(58) Field of Classification Search
CPC ............. H01L 51/5275; H01L 27/3211; H01L 51/5237; H01L 51/5271; H01L 27/32; H01L 51/52
See application file for complete search history.

(56) References Cited

U.S. PATENT DOCUMENTS

2011/0215302 A1* 9/2011 Lhee .................. H01L 27/3211
257/40

\* cited by examiner

*Primary Examiner* — Donald Raleigh
*Assistant Examiner* — Kevin Quarterman
(74) *Attorney, Agent, or Firm* — Harness, Dickey & Pierce, P.L.C.

(57) ABSTRACT

The disclosed OLED display panel includes: an OLED unit, including one or more pixel light-emitting units, wherein light emitted from the pixel light-emitting units is transmitted in a first area; a rotatable optical component, arranged on a transmission path of the light emitted from the pixel light-emitting units, wherein the light emitted from the pixel light-emitting units is transmitted onto the optical component and then reflected by the same, and light reflected by the optical component, when the optical component is rotated, is projected onto a second area within a predetermine period, wherein the second area is larger than the first area; and a light-transmitting display substrate, arranged on a transmission path of the light reflected by the optical component and arranged corresponding to the second area.

20 Claims, 4 Drawing Sheets

OLED DISPLAY PANEL AND DISPLAY DEVICE INCLUDING THE SAME

CROSS-REFERENCE TO RELATED APPLICATION

This application is the U.S. national phase of PCT Application No. PCT/CN2015/090075 filed on Sep. 21, 2015, which claims a priority to Chinese Patent Application No. 201520275554.2 filed on Apr. 30, 2015, the disclosures of which are incorporated in their entirety by reference herein.

TECHNICAL FIELD

The present disclosure relates to the field of displayer technology, and in particular to an OLED display panel and a display device including the same.

BACKGROUND

For an organic light-emitting diode (OLED) display at present using an OLED to display, a light and thin display is desired by the user and the manufacturer.

FIG. 1 is a schematic view showing an OLED displayer in the related art. An OLED unit 3 arranged between a first substrate 1 and a second substrate 2 has a size and an area corresponding to the first substrate 1 and the second substrate 2, and the region corresponding to the first substrate 1 and the second substrate 2 forms a display area of the display, therefore the size of the OLED unit 3 is required to correspond to the entire display area. However, a manufacturing technology of an OLED light-emitting unit is not mature, so the production cost is high, and it is difficult to reduce the cost especially when using an outdoor large-size OLED display.

SUMMARY

An object of the present disclosure is to provide an OLED display panel and a display device including the same, whereby a display by the entire display screen may be realized by using one bar-like OLED unit, thereby reducing a manufacturing cost when applying a large-size OLED unit in the displayer.

An OLED display panel is provided by the present disclosure, including:

an OLED unit, including one or more pixel light-emitting units, wherein light emitted from the pixel light-emitting units is transmitted in a first area;

a rotatable optical component, arranged on a transmission path of the light emitted from the pixel light-emitting units, wherein the light emitted from the pixel light-emitting units is transmitted onto the optical component and then reflected by the same, and light reflected by the optical component, when the optical component is rotated, is projected onto a second area within a predetermine period, wherein the second area is larger than the first area; and a light-transmitting display substrate, arranged on a transmission path of the light reflected by the optical component and arranged corresponding to the second area.

Optionally, the OLED display panel further includes a lens arranged at a side of the light-transmitting display substrate where the light reflected by the optical component enters, wherein the light reflected by the optical component is transmitted and passed through the lens, and the transmission direction of the light reflected by the optical component is changed from different directions to a same direction after passing through the lens.

Optionally, the light reflected by the optical component, which is transmitted along different directions, is transmitted along a direction perpendicular to the light-transmitting display substrate after passing through the lens.

Optionally, the optical component includes a plurality of protruded prisms with different inclination angles.

Optionally, the OLED display panel further includes a roller, wherein the plurality of protruded prisms is arranged on a part of an external surface of the roller.

Optionally, the OLED display panel further includes a roller, wherein the plurality of protruded prisms is arranged on the entire external surface of the roller.

Optionally, each pixel light-emitting unit includes a plurality of sub pixel units which emit different colors of light, wherein the plurality of sub pixel units which emit different colors of light is arranged in the first area in sequence along a third direction, and an axis direction of the roller is perpendicular to the third direction.

Optionally, each sub pixel unit includes an anode layer, a cathode layer and an organic functional layer arranged between the anode layer and the cathode layer, wherein the organic functional layer includes a hole transport layer, a light-emitting layer and an electron transport layer.

Optionally, a light-emitting surface of the OLED unit includes a first edge and a second edge which are perpendicular to each other, wherein the third direction is parallel to the first edge, and a width of the second edge is equal to or smaller than a length of the protruded prisms extending along the axis direction of the roller.

Optionally, the light emitted from the pixel light-emitting units is transmitted in the first area along a first direction, and the light reflected by the optical component which is transmitted along different directions is transmitted along a second direction after passing through the lens, wherein the second direction is perpendicular to the first direction.

Optionally, the optical component is rotated clockwise or anticlockwise within the predetermined period.

Optionally, the OLED display panel further includes a case body, wherein the light-transmitting display substrate is arranged at a first side of the case body, and the OLED unit is arranged at a second side of the case body, wherein the second side is perpendicular to the first side; the optical component is arranged at a position where a third side and a fourth side which are adjacent to each other are connected.

A display device is further provided by the present disclosure, including at least one OLED display panel hereinabove, wherein the light-transmitting display substrates of the OLED display panels are jointed together to form a display screen of the display device Optionally, the display device hereinabove further includes a control structure for controlling light-emitting status of the OLED unit of each OLED display panel.

According to at least one of the technical solutions hereinabove, by reflection of the light emitted from the OLED unit by the rotatable optical component and the rotation of the rotatable optical component, the area of the light emitted from the OLED unit with a small light-emitting area or even a single OLED unit may be enlarged to become a large-area surface light source, therefore the area of the OLED unit is not required to correspond to the entire display area of the display screen, thereby reducing a manufacturing cost when applying a large-size OLED unit in the display.

DETAILED DESCRIPTION

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In order to make the objects, the technical solutions and the advantages of the present disclosure more apparent, the present disclosure will be described hereinafter in conjunction with the drawings and embodiments.

Figure 1:
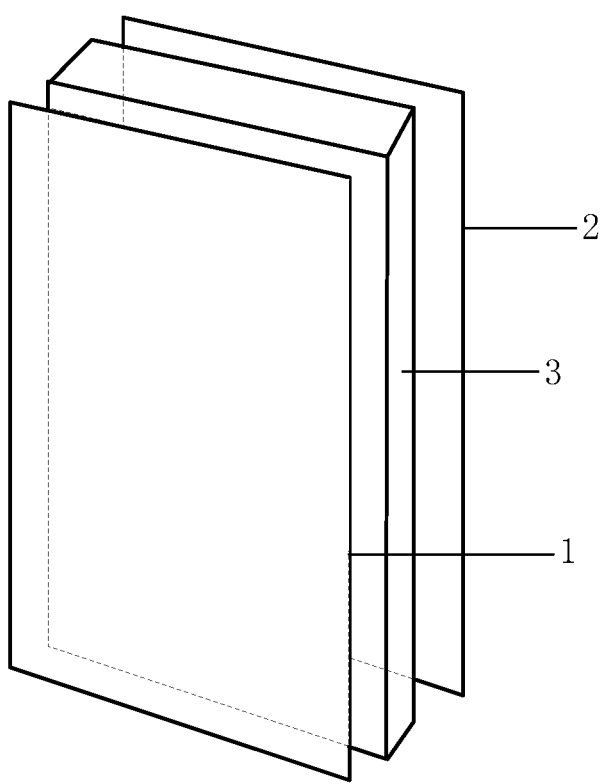
FIG. 1 is a schematic view showing an OLED display.
Figure 2:
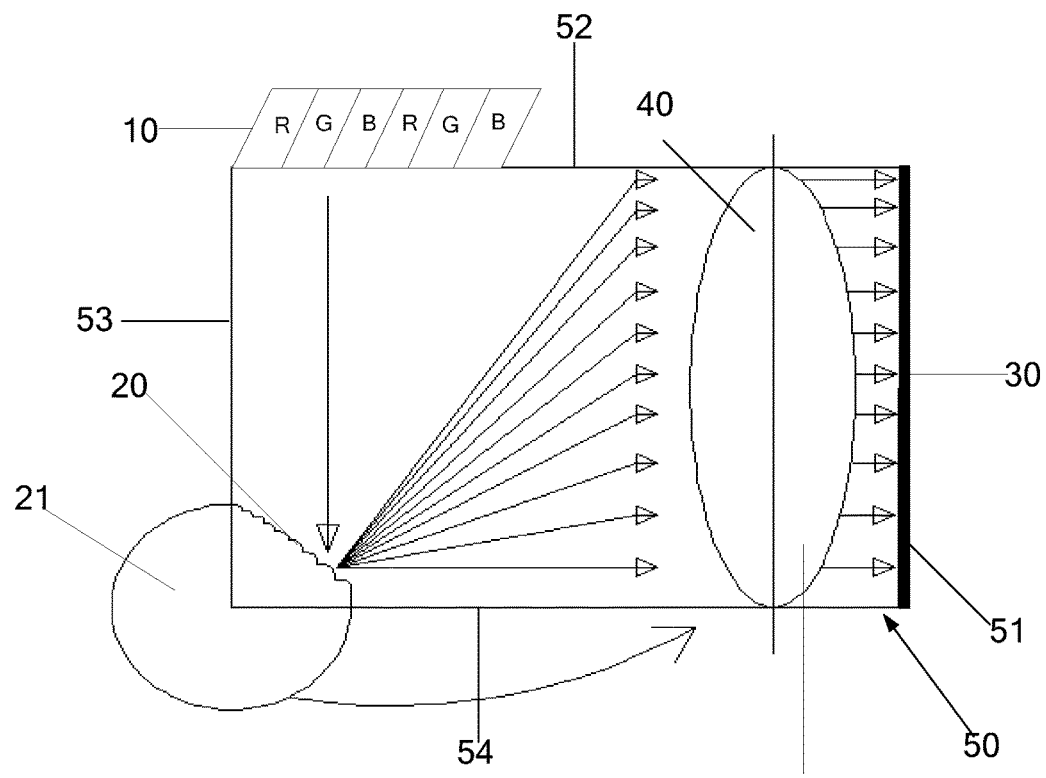
FIG. 2 is a schematic view showing an OLED display panel according to some embodiments of the present disclosure.

A structure and a working principle of an OLED unit according to some embodiments of the present disclosure will be described in details in conjunction with FIG. 2. Referring to FIG. 2, the OLED display panel includes:

an OLED unit 10, including one or more pixel light-emitting units, wherein light in different colors emitted from the pixel light-emitting units are transmitted in a first area;

a rotatable optical component 20, arranged on a transmission path of the light emitted from the pixel light-emitting units, wherein the light emitted from the pixel light-emitting units is incoming onto the optical component and then reflected by the same, and light reflected by the optical component 20, when the optical component 20 is rotated, is projected onto a second area within a predetermine period, wherein the second area is larger than the first area; and a light-transmitting display substrate 30, arranged on a transmission path of the light reflected by the optical component 20 and arranged corresponding to the second area.

According to the OLED display panel of the structure hereinabove, by the reflection of the light emitted from the OLED unit by the rotatable optical component and the rotation of the rotatable optical component, the light emitted from a relative small light-emitting area of the OLED unit may be projected onto a larger area within the predetermined period, such that the area of light emitted from the OLED unit with a small light-emitting area or even a single OLED unit may be enlarged to become a large-area surface light source, therefore the area of the OLED unit is not required to correspond to the entire display area of the display screen, thereby reducing a manufacturing cost when applying a large-size OLED unit in the display.

Figure 3:
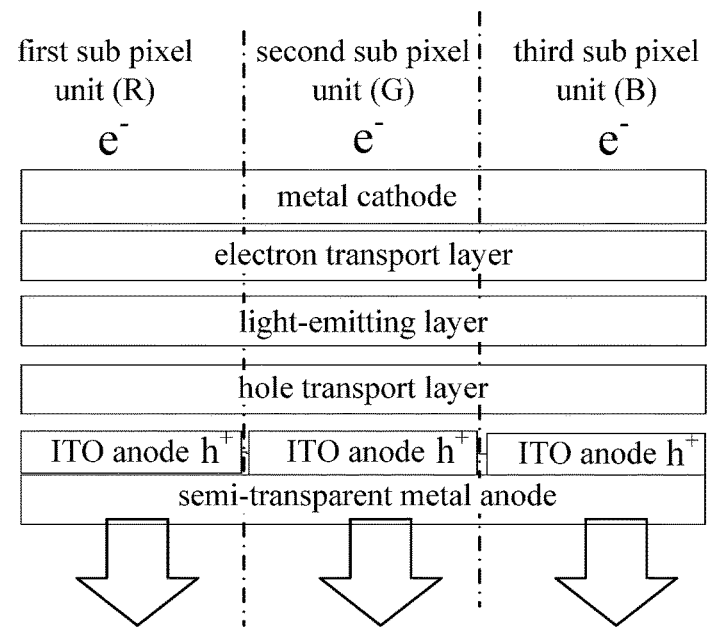
FIG. 3 is a sectional view of an OLED unit according to some embodiments of the present disclosure.

In the OLED display panel according to some embodiments of the present disclosure, the OLED unit 10 has a structure of the OLED device in the related art, which includes one or more pixel light-emitting units, and each pixel light-emitting unit includes sub pixel units which emit at least three colors of light (e.g., a plurality of sub pixel units which emit red, green and blue light). FIG. 3 is a schematic view showing a pixel light-emitting unit. A first sub pixel unit displaying a first color, a second sub pixel unit displaying a second color and a third sub pixel unit displaying a third color each includes an anode layer, a cathode layer and an organic functional layer arranged between the anode layer and the cathode layer, wherein the organic functional layer includes a hole transport layer, a light-emitting layer and an electron transport layer. In different sub pixel units, light-emitting layers are formed by different materials, so as to emit different colors of light. The sub pixel units emitting red, green and blue light are arranged in sequence, so as to realize a color image display.

The structure of the OLED 10 hereinabove is known by those skilled in the art, and the detailed description thereof is omitted herein.

Figure 4:
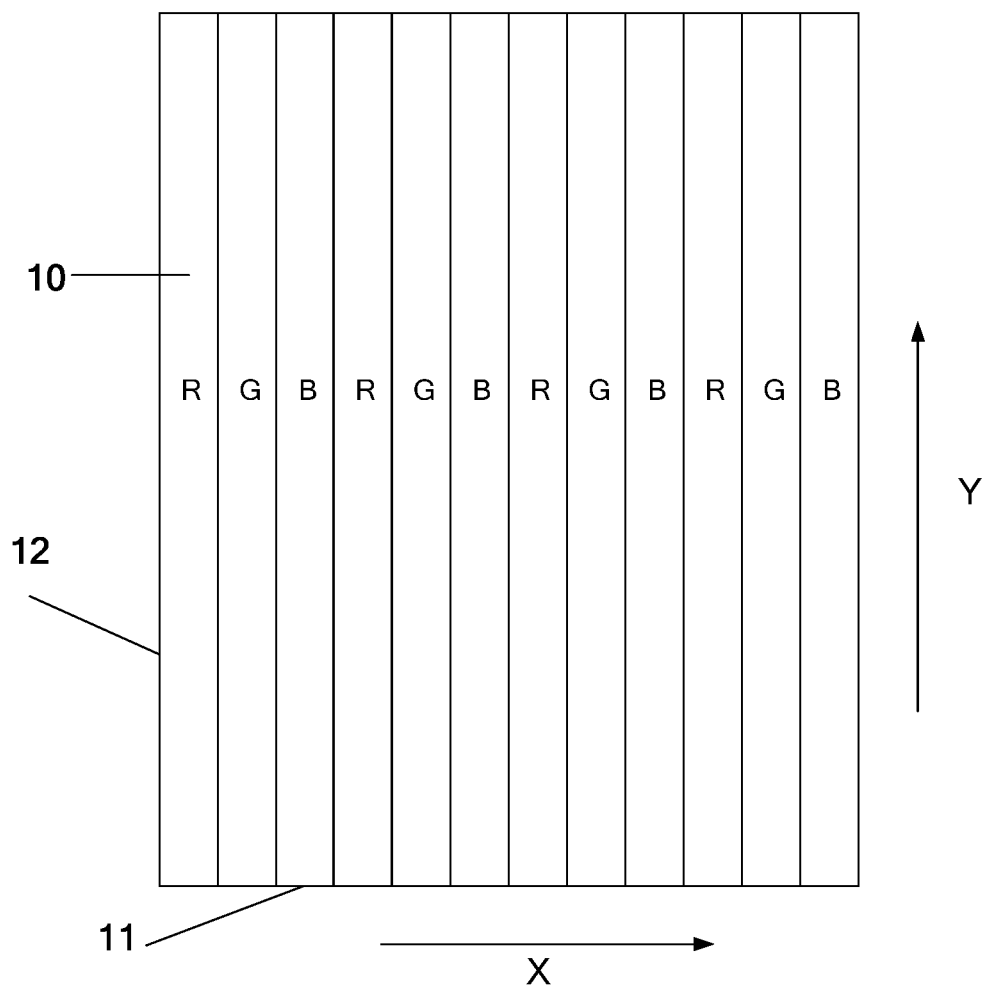
FIG. 4 is a plan view of an OLED unit according to some embodiments of the present disclosure.

FIG. 4 is a plan view of a bar-like OLED unit 10. For example, adjacent two edges of the OLED unit 10 extend along a X direction (a third direction) and a Y direction (a second direction) respectively, and each sub pixel unit thereof is bar-like, wherein a lengthwise direction of each sub pixel unit is the Y direction and the sub pixel units are arranged along the X direction, such that the OLED 10 with a certain width along the X direction is formed.

By the arrangement hereinabove, the light-emitting area of the pixel light-emitting unit is an area enclosed by four edges of the pixel light-emitting unit, and the entire light-emitting area of the OLED unit 10 is an area enclosed by four edges of the OLED unit 10 (i.e., a first area).

Figure 5:
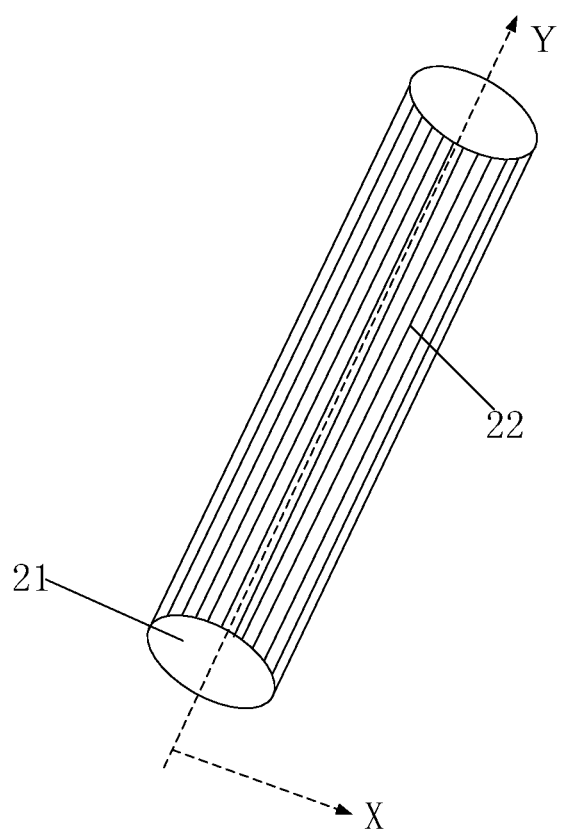
FIG. 5 is a schematic view showing an optical component.

FIG. 5 is a schematic view showing the optical component 20. In some embodiments of the present disclosure, the optical component 20 includes a plurality of protruded prisms 22 with different inclination angles. Referring to FIG. 5, the optical component 20 is arranged around a rotatable roller 21, and the plurality of protruded prisms 22 is arranged on a part of an external surface of the roller 21. A lengthwise direction of each protruded prism 22 is parallel to an axis direction of the roller 21, and the plurality of protruded prisms 22 is arranged in sequence on the external surface of the roller 21.

As shown in FIG. 2, the optical component is arranged at a side of the OLED unit 10. The sub pixel units of the OLED unit 10 are arranged along the X direction (the third direction), and the axis direction of the roller 21 around which the protruded prisms 22 are arranged is perpendicular to the X direction (i.e., parallel to the Y direction), such that an extending direction of each protruded prism 22 is parallel to the lengthwise direction of each sub pixel unit.

As shown in FIG. 4, a first edge 11 of a light-emitting surface of the OLED 10 extends along the X direction (i.e., the third direction), and a second edge 12 (i.e., the edge extending along the Y direction) which is perpendicular to the first edge 11 of the OLED unit 10 has a certain width. Optionally, the width is equal to or smaller than the length of each protruded prism 22 extending along the axis direction of the roller 21, such that all the light emitted from the light-emitting surface of the OLED 10 may be transmitted onto the protruded prisms 22.

In addition, the length of each pixel light-emitting unit of the OLED unit 10 extending along the Y direction may be equal to a length of the second edge 12 of the OLED unit 10.

According to the arrangement of the optical component 20 and the OLED unit 10 hereinabove, the optical component 20 is arranged at a side of the OLED unit 10 and on the transmission path of the light emitted from the OLED unit 10, and the light emitted from the OLED unit 10 may further be transmitted onto part of the prisms of the optical component 20.

By the optical component 20 hereinabove, the light emitted from the pixel light-emitting units of the OLED unit 10 is transmitted along the first direction and the first area is formed, and then the light is transmitted onto the prism structure and then reflected by the same. When the optical component 20 is not rotated, after the light emitted from the OLED unit 10 is reflected by part of the prisms, an irradiation area of the reflected light has no obvious difference with an irradiation area of the light emitted from the OLED unit 10. When the optical component 20 is rotated at a high speed, the light emitted from the OLED unit 10 may be projected onto different protruded prisms 22 of the optical component 20 at different time points of the predetermined period. Because inclination angles of the protruded prisms 22 are different, the light may be reflected in different angles by the protruded prisms 22 and then projected onto the second area within the predetermined period, wherein the second area is larger than the first area. Referring to FIG. 2, the second area may be corresponding to the whole area of the light-transmitting display substrate 30.

In some embodiments of the present disclosure, referring to FIG. 2, the roller 21 of the optical component 20 may be arranged to rotate clockwise or anticlockwise. However, whether the roller 21 is rotated clockwise or anticlockwise, it should be guaranteed that, by the arrangement of the protruded prisms 22 of the optical component 20, all the light emitted from the OLED unit 10 may be projected onto the protruded prisms 22 rather than other areas outside the protruded prisms 22 within the predetermined period of the rotation of the roller 21. Optionally, the protruded prisms 22 are arranged on the entire external surface of the roller 21.

Furthermore, in order to make the light transmitting to the light-transmitting display substrate 30 to be parallel light (i.e., similar to light emitted from a surface light source), referring to FIG. 2, the OLED display panel according to some embodiments of the present disclosure further includes a lens 40 arranged at a side of the light-transmitting display substrate 30 where the light reflected by the optical component 20 enters. By the lens 40, the light reflected along different directions by the optical component 20 are all transmitted along the third direction after passing through the lens 40. Optionally, the third direction is perpendicular to the light-transmitting display substrate 30 and the transmission direction of the light emitted from the OLED unit 10 (the first direction).

According to some embodiments of the present disclosure, after the light emitted from the pixel light-emitting units of the OLED unit 10 is reflected by the optical component 20, the reflected light is projected onto the second area within the predetermined period. The light-transmitting display substrate 30 is arranged based on the second area. That is, all the light reflected by the optical component 20 is projected onto the light-transmitting display substrate 30. Correspondingly, the lens 40 is parallel to the light-transmitting display substrate 30, and the lens 40 is arranged at a side of the light-transmitting display substrate 30 adjacent to the optical component 20 and also arranged based on the second area, such that all the light reflected by the optical component 20 may be transmitted onto the light-transmitting display substrate 30 after passing through the lens 40.

By the arrangement hereinabove, when the roller 22 is rotated at a high speed within the predetermined period, the light emitted from the OLED unit 10 is reflected by the optical component 20, and then the light reflected by the optical component 20 is projected onto an area corresponding to the light-transmitting display substrate 30 from up bottom or from bottom up within the predetermined period, so as to light up the light-transmitting display substrate 30 from up bottom or from bottom up, thereby realizing one time of data refreshing and displaying an image. When the entire OLED unit 10 emits red light, the light-transmitting display substrate 30 displays a red image; when the entire OLED unit 10 emits green light, the light-transmitting display substrate 30 displays a green image; when the entire OLED unit 10 emits blue light, the light-transmitting display substrate 30 displays a blue image.

Optionally, in order to make a lightness of the light-transmitting display substrate 30 uniform, a power supply or an optical energy lost of the OLED unit 10 may be adjusted to output incrementally or degressively light within one refreshing period.

Furthermore, referring to FIG. 2, the OLED display panel according to some embodiments of the present disclosure further includes a case body 50, wherein the light-transmitting display substrate 30 is arranged at a first side 51 of the case body 50, and the OLED unit 10 is arranged at a second side 52 of the case body 50, wherein the second side 52 is perpendicular to the first side 51; the optical component 20 is arranged at a position where a third side 53 and a fourth side 54 which are adjacent to each other are connected.

The OLED display panel according to some embodiments of the present disclosure has a structure different from that of the OLED display panel in the related art, wherein the OLED unit, which is smaller than the light-transmitting display substrate, is arranged at a side of the light-transmitting display substrate rather than parallel to the light-transmitting display substrate, such that the OLED unit may be made smaller in a large-screen OLED display, thereby reducing a manufacturing cost when a large-size OLED unit is applied.

A display device is further provided by some embodiments of the present disclosure, including at least one OLED display panel hereinabove, and the light-transmitting display substrates of the OLED display panels are jointed together to form a display screen of the display device.

Furthermore, the display device further includes a control structure for controlling light-emitting status of the OLED unit of each OLED display panel. Each OLED display panels is controlled by the control structure to display with a lightness or with a color corresponding to the area where the OLED display panel is arranged, such that a predetermined pattern may be displayed on the entire display screen formed by jointing the OLED display panels together.

The above are merely the optional embodiments of the present disclosure. A person skilled in the art may make further modifications and improvements without departing from the principle of the present disclosure, and these modifications and improvements shall also fall within the scope of the present disclosure.

What is claimed is:

1. An organic light-emitting diode (OLED) display panel, comprising:
   an OLED unit, comprising one or more pixel light-emitting units, wherein light emitted from the pixel light-emitting units is transmitted in a first area;
   a rotatable optical component, arranged on a transmission path of the light emitted from the pixel light-emitting units, wherein the light emitted from the pixel light-emitting units is transmitted onto the optical component and then reflected by the optical component, and light reflected by the optical component, when the optical component is rotated, is projected onto a second area within a predetermine period, wherein the second area is larger than the first area; and a light-transmitting display substrate, arranged on a transmission path of the light reflected by the optical component and arranged corresponding to the second area.

2. The OLED display panel according to claim 1, further comprising a lens arranged at a side of the light-transmitting display substrate where the light reflected by the optical component enters, wherein the light reflected by the optical component is transmitted and passed through the lens, and the transmission direction of the light reflected by the optical component is changed from different directions to a same direction after passing through the lens.

3. The OLED display panel according to claim 2, wherein the light reflected by the optical component, which is transmitted along different directions, is transmitted along a direction perpendicular to the light-transmitting display substrate after passing through the lens.

4. The OLED display panel according to claim 1, wherein the optical component comprises a plurality of protruded prisms with different inclination angles.

5. The OLED display panel according to claim 4, further comprising a roller, wherein the plurality of protruded prisms is arranged on a part of an external surface of the roller.

6. The OLED display panel according to claim 4, further comprising a roller, wherein the plurality of protruded prisms is arranged on the entire external surface of the roller.

7. The OLED display panel according to claim 5 or 6, wherein each pixel light-emitting unit comprises a plurality of sub pixel units which emit different colors of light, wherein the plurality of sub pixel units which emit different colors of light is arranged in the first area in sequence along a third direction, and an axis direction of the roller is perpendicular to the third direction.

8. The OLED display panel according to claim 7, wherein each sub pixel unit comprises an anode layer, a cathode layer and an organic functional layer arranged between the anode layer and the cathode layer, wherein the organic functional layer comprises a hole transport layer, a light-emitting layer and an electron transport layer.

9. The OLED display panel according to claim 7, wherein a light-emitting surface of the OLED unit comprises a first edge and a second edge which are perpendicular to each other, wherein the third direction is parallel to the first edge, and a width of the second edge is equal to or smaller than a length of the protruded prisms extending along the axis direction of the roller.

10. The OLED display panel according to claim 2, wherein the light emitted from the pixel light-emitting units is transmitted in the first area along a first direction, and the light reflected by the optical component which is transmitted along different directions is transmitted along a second direction after passing through the lens, wherein the second direction is perpendicular to the first direction.

11. The OLED display panel according to claim 1, wherein the optical component is rotated clockwise or anticlockwise within the predetermined period.

12. The OLED display panel according to claim 1, further comprising a case body, wherein the light-transmitting display substrate is arranged at a first side of the case body, and the OLED unit is arranged at a second side of the case body, wherein the second side is perpendicular to the first side; the optical component is arranged at a position where a third side and a fourth side which are adjacent to each other are connected.

13. A display device, comprising at least one OLED display panel according to claim 1, wherein the light-transmitting display substrates of the OLED display panels are jointed together to form a display screen of the display device.

14. The display device according to claim 13, further comprising a control structure for controlling light-emitting status of the OLED unit of each OLED display panel.

15. The OLED display panel according to claim 6, wherein each pixel light-emitting unit comprises a plurality of sub pixel units which emit different colors of light, wherein the plurality of sub pixel units which emit different colors of light is arranged in the first area in sequence along a third direction, and an axis direction of the roller is perpendicular to the third direction.

16. The OLED display panel according to claim 2, further comprising a case body, wherein the light-transmitting display substrate is arranged at a first side of the case body, and the OLED unit is arranged at a second side of the case body, wherein the second side is perpendicular to the first side; the optical component is arranged at a position where a third side and a fourth side which are adjacent to each other are connected.

17. The OLED display panel according to claim 3, further comprising a case body, wherein the light-transmitting display substrate is arranged at a first side of the case body, and the OLED unit is arranged at a second side of the case body, wherein the second side is perpendicular to the first side; the optical component is arranged at a position where a third side and a fourth side which are adjacent to each other are connected.

18. The OLED display panel according to claim 4, further comprising a case body, wherein the light-transmitting display substrate is arranged at a first side of the case body, and the OLED unit is arranged at a second side of the case body, wherein the second side is perpendicular to the first side; the optical component is arranged at a position where a third side and a fourth side which are adjacent to each other are connected.

19. The OLED display panel according to claim 5, further comprising a case body, wherein the light-transmitting display substrate is arranged at a first side of the case body, and the OLED unit is arranged at a second side of the case body, wherein the second side is perpendicular to the first side; the optical component is arranged at a position where a third side and a fourth side which are adjacent to each other are connected.

20. The OLED display panel according to claim 6, further comprising a case body, wherein the light-transmitting display substrate is arranged at a first side of the case body, and the OLED unit is arranged at a second side of the case body, wherein the second side is perpendicular to the first side; the optical component is arranged at a position where a third side and a fourth side which are adjacent to each other are connected.

* * * * *